(12) United States Patent
Han et al.

(10) Patent No.: US 9,287,436 B2
(45) Date of Patent: Mar. 15, 2016

(54) DISPLAY DEVICE AND MANUFACTURING METHOD THEREOF

(71) Applicants: SAMSUNG DISPLAY CO., LTD., Yongin, Gyeonggi-Do (KR); INDUSTRY-ACADEMIC COOPERATION FOUNDATION, YONSEI UNIVERSITY, Seoul (KR); ULSAN COLLEGE INDUSTRY COOPERATION, Ulsan (KR)

(72) Inventors: Sang Youn Han, Seoul (KR); Cheol Kyu Kim, Seoul (KR); Jun Ho Song, Seongnam-si (KR); Sung Hoon Yang, Seoul (KR); Kyung Tea Park, Seoul (KR); Seung Mi Seo, Hwaseong-si (KR); Suk Won Jung, Goyang-si (KR); Do Young Kim, Ulsan (KR); Sun Jo Kim, Seoul (KR); Hyung Jun Kim, Seoul (KR)

(73) Assignees: SAMSUNG DISPLAY CO., LTD. (KR); INDUSTRY-ACADEMIC COOPERATION FOUNDATION, YONSEI UNIVERSITY (KR); ULSAN COLLEGE INDUSTRY COOPERATION (KR)

(*) Notice: Subject to any disclaimer, the term of this patent is extended or adjusted under 35 U.S.C. 154(b) by 113 days.

(21) Appl. No.: 13/717,914

(22) Filed: Dec. 18, 2012

(65) Prior Publication Data
US 2014/0021518 A1    Jan. 23, 2014

(30) Foreign Application Priority Data
Jul. 18, 2012    (KR) .................. 10-2012-0078428

(51) Int. Cl.
H01L 31/18    (2006.01)
H01L 27/144    (2006.01)
H01L 27/146    (2006.01)

(52) U.S. Cl.
CPC ........ H01L 31/1812 (2013.01); H01L 27/1443 (2013.01); H01L 27/14623 (2013.01); H01L 27/14632 (2013.01); H01L 27/14679 (2013.01)

(58) Field of Classification Search
None
See application file for complete search history.

(56) References Cited

U.S. PATENT DOCUMENTS 6,348,407 B1    2/2002    Gupta et al.
6,462,397 B2    10/2002   Ryum et al.
(Continued)

FOREIGN PATENT DOCUMENTS

JP    06120499 A    4/1994
JP    10065178 A    3/1998
(Continued)

*Primary Examiner* — Steven Loke
*Assistant Examiner* — Juanita Rhodes
(74) *Attorney, Agent, or Firm* — Cantor Colburn LLP (57) ABSTRACT

A display device includes: a first substrate; a photo transistor on the first substrate; and a switching transistor connected to the photo transistor. The photo transistor includes a light blocking film on the first substrate, a first gate electrode on the light blocking film and in contact with the light blocking film, a first semiconductor layer on the first gate electrode and overlapping the light blocking film, and a first source electrode and a first drain electrode on the first semiconductor layer. The switching transistor includes a second gate electrode on the first substrate, a second semiconductor layer on the second gate electrode and overlapping the second gate electrode, and a second source electrode and a second drain electrode on the second semiconductor layer. The first semiconductor layer and the second semiconductor layer are at a same layer of the display device, and each includes crystalline silicon germanium.

13 Claims, 8 Drawing Sheets

(56) References Cited

U.S. PATENT DOCUMENTS

| | | |
|---|---|---|
| 7,122,296 B2 | 10/2006 | Sabnis et al. |
| 8,026,535 B2 | 9/2011 | Wakagi et al. |
| 8,110,863 B2 | 2/2012 | Scheuerlein |
| 2003/0229270 A1* | 12/2003 | Suzuki .................. A61B 1/043 600/178 |
| 2005/0016586 A1 | 1/2005 | Kim et al. |
| 2005/0161674 A1* | 7/2005 | Fujimoto ............ H01L 27/1214 257/66 |
| 2008/0258133 A1 | 10/2008 | Seong |
| 2009/0268118 A1* | 10/2009 | Chang .................. G09G 3/3648 349/48 |
| 2010/0032289 A1 | 2/2010 | Wang et al. |
| 2011/0089416 A1* | 4/2011 | Yamazaki ......... H01L 21/02565 257/43 |
| 2011/0109609 A1* | 5/2011 | Jeong .................. H01L 31/1136 345/211 |
| 2011/0177696 A1 | 7/2011 | Yano et al. |

FOREIGN PATENT DOCUMENTS

| | | |
|---|---|---|
| JP | 2010226136 A | 10/2010 |
| KR | 101054340 B1 | 7/2005 |
| KR | 100691800 B1 | 2/2007 |
| KR | 1020070046310 A | 5/2007 |
| KR | 101068490 B1 | 9/2011 |

* cited by examiner

DISPLAY DEVICE AND MANUFACTURING METHOD THEREOF

This application claims priority to Korean Patent Application No. 10-2012-0078428 filed on Jul. 18, 2012, and all the benefits accruing therefrom under 35 U.S.C. §119, the entire contents of which are incorporated herein by reference.

BACKGROUND (a) Field

The invention relates to a display device, and a method of manufacturing the display device.

(b) Description of the Related Art

A liquid crystal display device, which is one of the most widely used flat panel display devices, includes two display panels in which electric field generating electrodes, such as a pixel electrode and a common electrode, are formed, and a liquid crystal layer interposed between the two display panels. The liquid crystal display device generates an electric field in the liquid crystal layer by applying a voltage to the electric field generating electrodes, determines a direction of liquid crystal molecules of the liquid crystal layer through the electric field, and controls polarization of an incident light, so as to display an image.

Research on a liquid crystal display device additionally having a touch sense function or an image sense function has been conducted. In order to implement the touch sense function or the image sense function, the liquid crystal display device additionally includes an infrared ray sensor and/or a visible ray sensor.

The infrared ray sensor among sensors of the liquid crystal display device may be formed by using a plasma-enhanced chemical vapor deposition ("PECVD") method for a semiconductor layer including amorphous silicon germanium. In the PECVD method for a semiconductor layer including amorphous silicon germanium, there is a problem in that a defect may be generated when the amorphous silicon is alloyed with the germanium, and a process becomes undesirably complex because a switching transistor including amorphous silicon is formed separately from the infrared ray sensor.

SUMMARY

One or more exemplary embodiment of the invention provides a display device, and a method of manufacturing the display device, having advantages of a simple process and an improved device characteristic.

An exemplary embodiment of the invention provides a display device including: a first substrate; a photo transistor positioned on the first substrate; and a switching transistor connected to the photo transistor. The photo transistor includes a light blocking film positioned on the first substrate, a first gate electrode positioned on the light blocking film and in contact with the light blocking film, a first semiconductor layer positioned on the first gate electrode and overlapping the light blocking film, and a first source electrode and a first drain electrode positioned on the first semiconductor layer. The switching transistor includes a second gate electrode positioned on the first substrate, a second semiconductor layer positioned on the second gate electrode and overlapping the second gate electrode, and a second source electrode and a second drain electrode positioned on the second semiconductor layer. The first semiconductor layer and the second semiconductor layer are positioned at a same layer of the display device, and the first semiconductor layer and the second semiconductor layer include crystalline silicon germanium.

The display device may further include a power line connected to the first gate electrode, and the power line and the first gate electrode may be at a same layer of the display device.

The first drain electrode may be connected to the second drain electrode.

The display device may further include a gate line connected to the second gate electrode.

The power line and the gate line may be positioned at a same layer of the display device.

The power line may apply a negative bias voltage to the first gate electrode.

The display device may further include the light blocking member disposed on the photo transistor.

The light blocking member may overlap the first semiconductor layer.

The light blocking member may have infrared ray transmittance equal to or less than about 0.1% and optical density equal to or higher than about 4.

The display device may further include a source signal line connected to the first source electrode.

The display device may further include a read out signal line connected to the second source electrode.

The display device may further include a second substrate facing the first substrate, and a pixel transistor disposed on the second substrate.

The first gate electrode may overlap the first drain electrode so as to form a maintenance capacitor configured to accumulate a leakage current generated in the first semiconductor layer.

Another exemplary embodiment of the invention provides a method of manufacturing a display device, including: providing a light blocking film on a first substrate; providing a first gate electrode contacting the light blocking film on the first substrate; providing a gate line including a second gate electrode on the first substrate; providing a gate insulating layer so as to cover the first gate electrode, the second gate electrode, and the gate line; providing a first semiconductor layer corresponding to the first gate electrode and a second semiconductor layer corresponding to the second gate electrode on the gate insulating layer; providing a first source electrode and a first drain electrode facing the first source electrode on the first semiconductor layer, and a second source electrode and a second drain electrode facing the second source electrode on the second semiconductor layer; and providing a passivation layer so as to cover the first source electrode, the first drain electrode, the second source electrode, and the second drain electrode. The providing the first semiconductor layer and the second semiconductor layer includes providing a semiconductor material layer including silicon and germanium on the gate insulating layer, and heat treating the semiconductor material layer.

The providing the semiconductor material layer may include providing the semiconductor material layer by a co-sputtering method by using a silicon source and a germanium source.

The heat treating of the semiconductor material layer may be performed at a temperature equal to or higher than about 400 degrees Celsius (° C.).

The first semiconductor layer and the second semiconductor layer may be simultaneously formed.

The providing of the semiconductor material layer by the co-sputtering method may include adjusting a composition of the silicon source and the germanium source by adjusting power of each of a power device respectively and independently connected to the silicon source and the germanium source.

The first semiconductor layer and the second semiconductor layer may include crystalline silicon germanium.

The method may further include providing a source signal line connected to the first source electrode, and a read out signal line connected to the second source electrode.

The method may further include providing a power line connected to the first gate electrode at a same layer of the display device as the gate line.

The providing of the semiconductor material layer by the co-sputtering method may be performed in a state including hydrogen gas.

The method may further include providing a light blocking member on the passivation layer so as to overlap the first semiconductor layer.

The light blocking member may have infrared ray transmittance equal to or less than about 0.1% and optical density equal to or higher than about 4.

The method may further include providing a second substrate facing the first substrate, and a pixel transistor positioned on the second substrate.

According to one or more exemplary embodiment of the invention, it is possible to simplify a manufacturing process of a display panel and a display device including the display panel and reduce defects generated while using amorphous silicon germanium, by simultaneously providing the semiconductor layer of the switching transistor and the semiconductor layer of the photo transistor of crystalline silicon germanium in the manufacturing process.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Hereinafter, exemplary embodiments of the invention will be described in detail with reference to the accompanying drawings. As those skilled in the art would realize, the described embodiments may be modified in various different ways, all without departing from the spirit or scope of the invention. On the contrary, exemplary embodiments introduced herein are provided to make disclosed contents thorough and complete and sufficiently transfer the spirit of the invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" or "lower" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Figure 1:
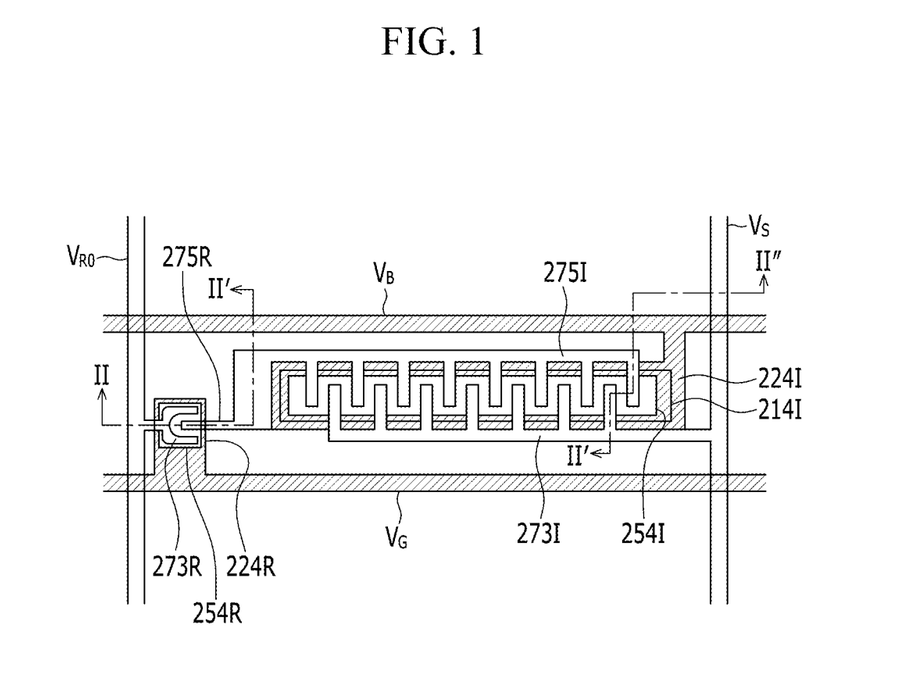
FIG. 1 is a top plan view illustrating an exemplary embodiment of a display device according to the invention.
Figure 2:
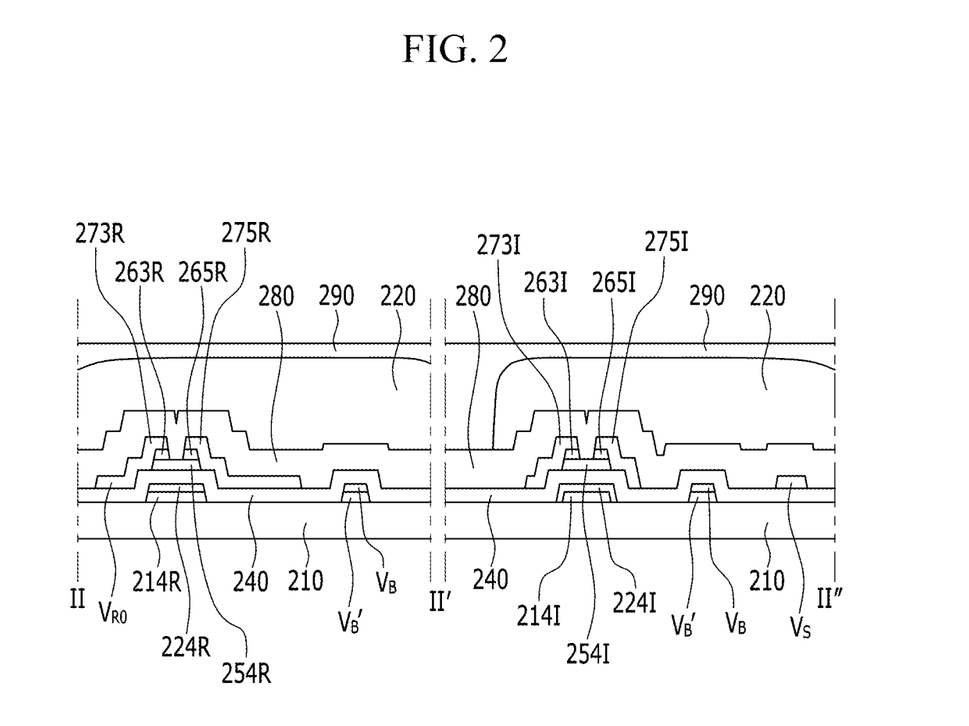
FIG. 2 is a cross-sectional view taken along lines II-II' and II'-II" of FIG. 1.

FIG. 1 is a top plan view illustrating an exemplary embodiment of a display device according to the invention. FIG. 2 is a cross-sectional view taken along lines II-II' and II'-II''' of FIG. 1.

Referring to FIGS. 1 and 2, the exemplary embodiment of a display device according to the invention includes a power line $V_B$ including a first gate electrode 224I and a gate line $V_G$ including a second gate electrode 224R. The power line $V_B$ and the gate line $V_G$ extend parallel to each other and are on a first substrate 210. The power line $V_B$ and the first gate electrode 224I are in a same layer of the display device, and the gate line $V_G$ and the second gate electrode 224R are in a same layer of the display device.

The first gate electrode 224I occupies a substantially wider planar area than that of the second gate electrode 224R. The second gate electrode 224R may have a shape protruding in a direction substantially vertical (e.g., perpendicular) to an extending direction, such as along a longitudinal axis, of the gate line $V_G$, but it is not limited to such a shape and may be changed.

Light blocking films 214I and 214R are positioned under the first gate electrode 224I and the second gate electrode 224R, respectively. The light blocking films 214I and 214R may include at least one of an organic material, amorphous silicon, amorphous silicon germanium and amorphous germanium including a black pigment. When the light blocking films 214I and 214R include amorphous silicon germanium (a-SiGe), a ratio of silicon to germanium included in the light blocking films 214I and 214R may be about 1:3.

The light blocking films 214I and 214R improve a signal to noise ratio ("SNR") by blocking visible rays incident to the display device from outside the display device, and optimize sensitivity of a semiconductor configured to sense light in an infrared ray region, thereby being capable of efficiently blocking influence by the visible rays.

The light blocking films 214I and 214R are in direct contact with the first gate electrode 224I and the second gate electrode 224R, so that an operation error of a transistor due to the light blocking films 214I and 214R may be reduced or effectively prevented. That is, when the light blocking films 214I and 214R including a semiconductor material are separated from the respective gate electrode, the light blocking films 214I and 214R may generate a fine charge by absorbing external light. As a result of generating the fine charge, the light blocking films 214I and 214R may exert an undesirably influence on an operation of the transistor. Accordingly, when the light blocking films 214I and 214R are directly connected to the respective gate electrode and a voltage having a predetermined size is applied to the light blocking films 214I and 214R in order to reduce or effectively prevent the aforementioned phenomenon, the operation error of the transistor due to the light blocking films 214I and 214R may be reduced or effectively prevented.

A light blocking film pattern $V_B'$ may be positioned under the power line $V_B$. In an exemplary embodiment, the light blocking film pattern $V_B'$ may be positioned in a process where a blocking film layer material, a first gate electrode material and a second electrode material are simultaneously patterned after depositing the blocking film layer material, the first gate electrode material and the second electrode material. However, in an alternative exemplary embodiment, the light blocking film pattern $V_B'$ may be omitted.

The first gate electrode 224I and the second gate electrode 224R may have wider planar areas as compared to those of the light blocking films 214I and 214R positioned under the first gate electrode 224I and the second gate electrode 224R.

A gate insulating layer 240 is positioned on the first substrate 210 so as to cover the first gate electrode 224I, the second gate electrode 224R, the gate line $V_G$, and the power line $V_B$. The gate insulating layer 240 may include silicon nitride (SiNx), silicon oxide (SiOx), or the like, but is not limited thereto or thereby.

A first semiconductor layer 254I and a second semiconductor layer 254R are positioned on the gate insulating layer 240 so as to overlap the first gate electrode 224I and the second gate electrode 224R, respectively. The first semiconductor layer 254I and the second semiconductor layer 254R include a material, such as crystalline silicon germanium.

First and second source electrodes 273I and 273R, and first and second drain electrode 275I and 275R facing the first and second source electrodes 273I and 273R, are positioned about a channel of each of the first semiconductor layer 254I and the second semiconductor layer 254R, respectively. The first source electrode 273I is connected to a source signal line Vs, and the second source electrode 273R is connected to a read out signal line $V_{RO}$. The first drain electrode 275I includes a portion at which the first drain electrode 275I and the first source electrode 273I face each other, and the second drain electrode 275R includes a portion at which the second drain electrode 275R and the second source electrode 273R face each other. The first drain electrode 275I is physically and electrically connected to the second drain electrode 275R, so as to form a single, unitary, indivisible drain electrode member.

The source signal line $V_s$ and the read out signal line $V_{RO}$ extend parallel to each other, and intersect the gate line $V_G$ and the power line $V_B$.

The first gate electrode 224I, the first source electrode 273I and the first drain electrode 275I constitute a photo transistor, such as an infrared ray sensing transistor, together with the first semiconductor layer 254I. A channel of the photo transistor is on the first semiconductor layer 254I between the first source electrode 273I and the first drain electrode 275I.

The second gate electrode 224R, the second source electrode 273R and the second drain electrode 275R constitute a switching thin film transistor together with the second semiconductor layer 254R. A channel of the switching thin film transistor is on the second semiconductor layer 254R between the second source electrode 273R and the second drain electrode 275R.

Ohmic contacts 263I and 263R may be positioned respectively between the first semiconductor layer 254I and the first source electrode 273I, and between the second semiconductor layer 254R and the second source electrode 273R. Ohmic contacts 265I and 265R may be positioned respectively between the first semiconductor layer 254I and the first drain electrode 275I, and between the second semiconductor layer 254R and the second drain electrode 275R. The ohmic contacts 263I, 263R, 265I and 265R may include a material, such as n+ hydrogenated amorphous silicon, in which an n-type impurity such as phosphorus is doped in a high concentration, or silicide.

Because the photo transistor in the illustrated exemplary embodiment is operated only by light, a negative bias is held in the power line $V_B$. Further, the first gate electrode 224I extending from the power line $V_B$ forms an electrode or terminal of one side of a maintenance capacitor, and the first drain electrode 275I of the photo transistor overlapping a substantially wide area of the first gate electrode 224I forms an electrode or terminal of the remaining side of the maintenance capacitor. Accordingly, the maintenance capacitor of the first gate electrode 224I and the first drain electrode 275I accumulates a leakage current generated in the semiconductor layer 254I by an operation of the photo transistor.

A passivation layer 280 is positioned on the first substrate 210 so as to cover the first source electrode 273I, the second source electrode 273R, the first drain electrode 275I, the second drain electrode 275R, a portion of the channel of the photo transistor, and a portion of the channel of the switching transistor.

The passivation layer 280 includes an inorganic insulator, such as silicon nitride or silicon oxide, but is not limited thereto or thereby. Alternatively, the passivation layer 280 may include an organic insulator. A surface of the passivation layer 280 may be planarized, but is not limited thereto or thereby.

A light blocking member 220 is positioned on the passivation layer 280 in such a manner as to overlap the photo transistor and the switching transistor. Particularly, the light blocking member 220 overlaps exposed portions of the first semiconductor layer 254I and the second semiconductor layer 254R at channels. Here, the light blocking member 220 may have an infrared ray transmittance of approximately 0.1% or less, and an optical density of approximately 4 or more. When the light blocking member 220 satisfies the aforementioned condition, the operation of the photo transistor may be reduced or effectively prevented even without a touch due to the exertion of the influence of the light generated in a backlight on the first semiconductor layer 254I.

An overcoat 290 may be positioned on the light blocking member 220.

Hereinafter, an exemplary embodiment of manufacturing the aforementioned display device will be described with reference to FIGS. 3 to 7 together with FIGS. 1 and 2.

Figure 3:
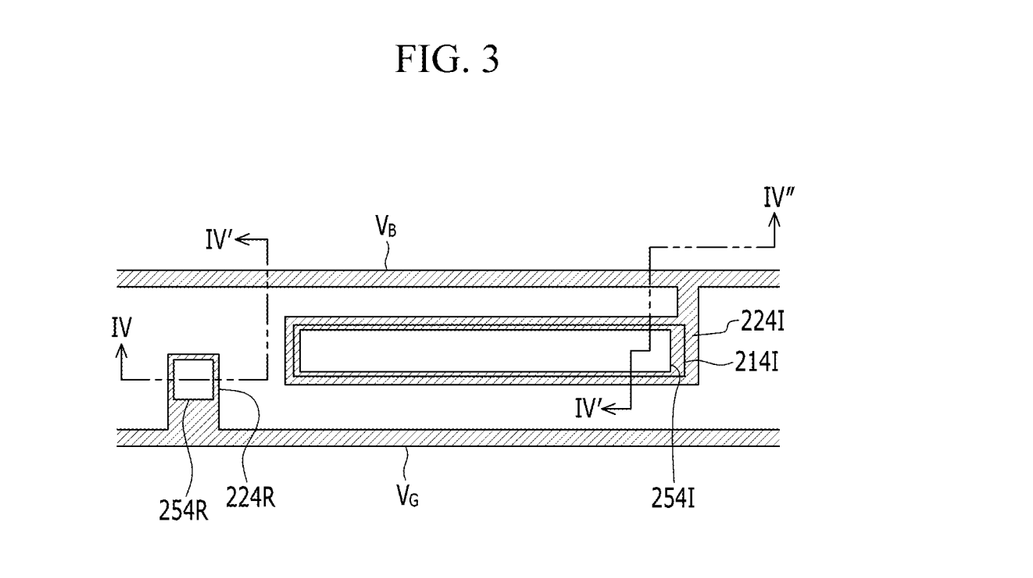
FIGS. 3 to 8 are top plan views and cross-sectional views illustrating an exemplary embodiment of a method of manufacturing the display device of FIG. 1 according to the invention.
Figure 4:
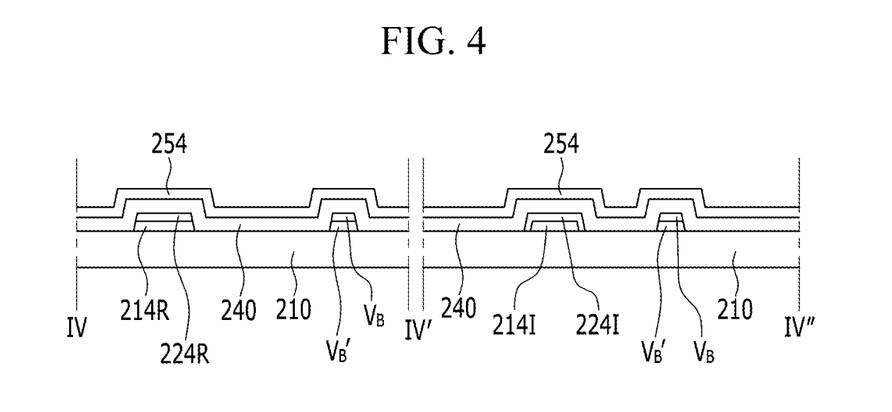
Figure 5:
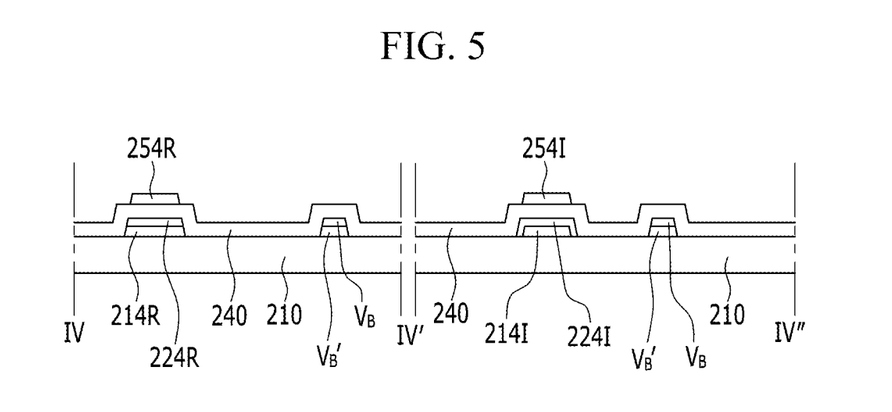
Figure 6:
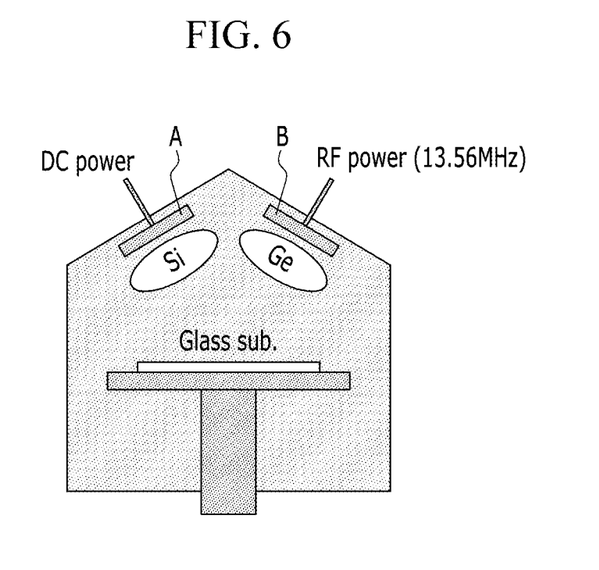
Figure 7:
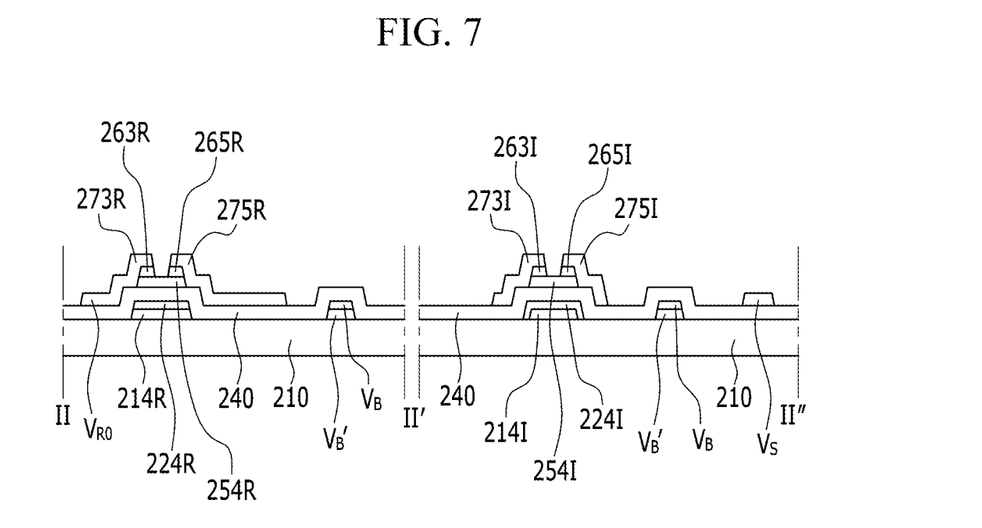
Figure 8:
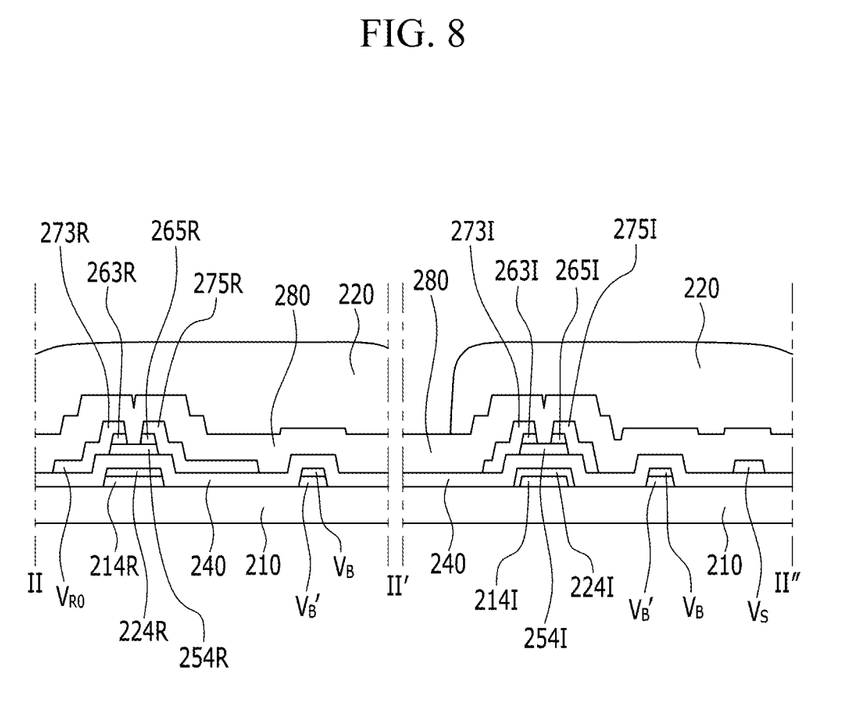

FIGS. 3 to 8 are top plan views and cross-sectional views illustrating an exemplary embodiment of a method of manufacturing the display device of FIG. 1 according to the invention. FIGS. 4 and 5 are cross-sectional views taken along lines IV-IV' and IV'-IV'' of FIG. 3. FIG. 6 is a schematic diagram schematically illustrating an exemplary embodiment of sputter equipment for forming a semiconductor layer according to the invention. FIG. 8 is a cross-sectional views taken along lines II-II' and II'-II'' of FIG. 1.

Referring to FIGS. 3 and 4, a light blocking film 214I is formed by applying a light blocking material on the first substrate 210 and then patterning the light blocking material. The light blocking material may include a semiconductor material. In one exemplary embodiment the semiconductor material includes amorphous silicon germanium (a-SiGe). The power line $V_B$ and the gate line $V_G$ extending in a first direction (e.g., horizontal direction in the view of FIGS. 1 and 3) are formed by applying a first conductive material on the first substrate 210 and patterning the first conductive material. The power line $V_B$ is formed so as to include the first gate electrode 224I protruding from the power line $V_B$ and overlapping the light blocking film 214I, and the gate line $V_G$ is formed so as to include the second gate electrode 224R protruding from the gate line $V_G$.

The gate insulating layer 240 is formed on the first substrate 210 so as to cover the first gate electrode 224I, the second gate electrode 224R, the gate line $V_G$ and the power line $V_B$. The gate insulating layer 240 may include silicon nitride (SiNx) or silicon oxide (SiOx).

Referring to FIG. 4, a semiconductor material layer 254 is deposited on the first substrate 210. The semiconductor material layer 254 may be formed on a substrate (Glass sub.) by a co-sputtering method by using a silicon (Si) source and a germanium (Ge) source. Here, referring to FIG. 6, each of a silicon target A and a germanium target B are independently connected to a power device, so that a composition of the silicon source and the germanium source may be adjusted by adjusting power of each power device.

As an exemplary embodiment, as illustrated in FIG. 6, the power device connected to the silicon target may supply direct current ("DC") power, and the power device connected to the germanium target may supply alternating current ("AC") power. Here, the DC power may have power in the range from 0 to about 300 watts (W), and a radio frequency ("RF") power with 13.56 MHz may have power in the range from 0 to about 600 W.

An exemplary embodiment of a process of forming the semiconductor material layer 254 by the co-sputtering method according to the invention may be performed in a state in which hydrogen and argon gas is included, but is not limited thereto or thereby.

The semiconductor material layer 254 is crystallized by heat treating the semiconductor material layer 254 at a temperature of approximately 400 degrees Celsius (° C.) or higher.

Referring to FIGS. 3 and 5, the first semiconductor layer 254I and the second semiconductor layer 254R are formed by patterning the semiconductor material layer 254. The first semiconductor layer 254I is formed so as to overlap the first gate electrode 224I, and the second semiconductor layer 254R is formed so as to overlap the second gate electrode 224R.

Since the first semiconductor layer 254I and the second semiconductor layer 254R are formed by simultaneously patterning the semiconductor material layer 254 deposited by the co-sputtering method, the first semiconductor layer 254I and the second semiconductor layer 254R may be formed of the same material and/or in a same layer of the display device. That is, the first semiconductor layer 254I and the second semiconductor layer 254R are both formed of crystalline silicon germanium.

The first semiconductor layer 254I may be formed to have a smaller planar area than that of the light blocking film 214I positioned under the first semiconductor layer 254I, but is not limited thereto or thereby.

Referring to FIGS. 1 and 7, the read out signal line $V_{RO}$ and the source signal line $V_s$ extending in a second direction (e.g., a vertical direction in FIGS. 1 and 3) are formed by applying a second conductive material on the first substrate 210 and then patterning the second conductive material. The read out signal line $V_{RO}$ and the source signal line $V_s$ are formed so as to intersect the gate line $V_G$ and the power line $V_B$ in a plan view of the display device.

In the patterning the second conductive material, the first source electrode 273I physically and electrically connected to the source signal line $V_s$ may be formed. The first source electrode 273I may include a relatively long and evenly shaped rod-shaped bar portion protruding from the source signal line $V_s$, and a plurality of source electrode units protruding from the bar portion. The first drain electrode 275I including a plurality of drain electrode units positioned facing the plurality of source electrode units is formed.

In the patterning the second conductive material, the second source electrode 273R physically and electrically connected to the read out signal line $V_{RO}$ and bent in a U-shape may be formed. The second drain electrode 275R facing the second source electrode 273R is formed with respect to the second semiconductor layer 254R. The first drain electrode 275I and the second drain electrode 275R may be formed in such a manner that the first drain electrode 275I is physically and electrically connected with the second drain electrode 275R.

Ohmic contacts 263I, 263R, 265I and 265R are formed on the substrate 210.

Referring to FIG. 8, the passivation layer 280 is formed on the first substrate 210 so as to cover the first source electrode 273I, the second source electrode 273R, the first drain electrode 275I, the second drain electrode 275R, a portion of a channel of the infrared ray sensing transistor, and a portion of the channel of the switching transistor. The passivation layer 280 may include an inorganic insulator, such as silicon nitride and silicon oxide, or an organic insulator. A surface of the passivation layer 280 may be planarized.

The light blocking member 220 is formed on the passivation layer 280 so as to overlap the photo transistor and the switching transistor. Here, the light blocking member 220 is formed so as to overlap the first semiconductor layer 254I and the second semiconductor layer 254R.

Accordingly, the display device described with reference to FIGS. 1 and 2 may be formed.

Figure 9:
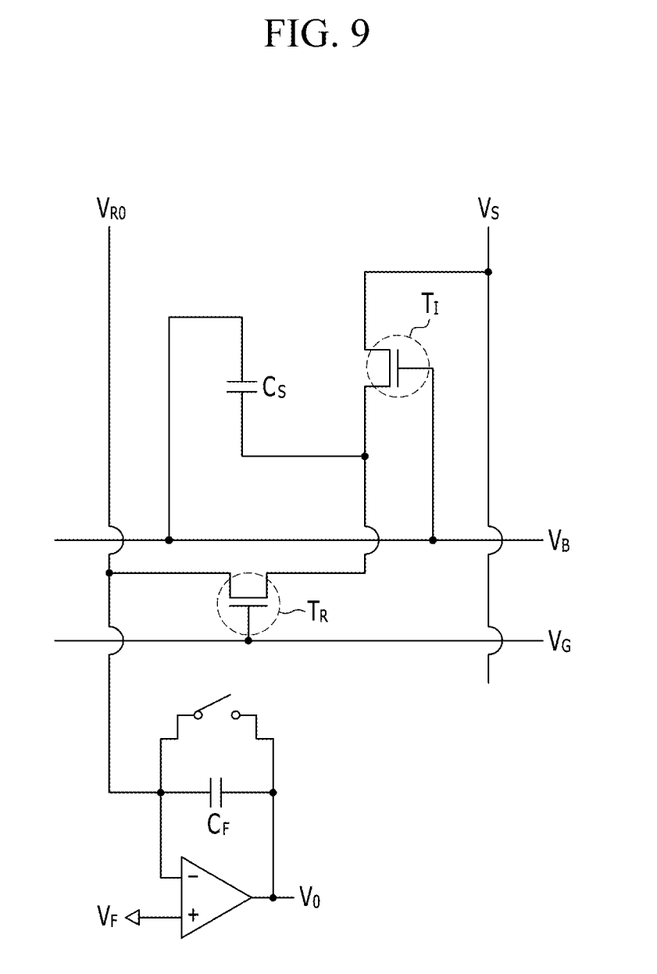
FIG. 9 is a circuit diagram illustrating an exemplary embodiment of a display device according to the invention.

FIG. 9 is a circuit diagram illustrating an exemplary embodiment of a display device according to the invention.

Referring to FIG. 9, a circuit connection relationship for the exemplary embodiment described with reference to FIGS. 1 and 2 is represented. When the switching transistor $T_R$ is turned on, a voltage corresponding to a difference between a voltage $V_F$ applied in the read out signal line $V_{RO}$ and the voltage applied in the power line $V_B$ is charged in the maintenance capacitor $C_s$.

When the switching transistor $T_R$ is turned off, and light, such as the infrared ray, inflows so that the light leakage current is generated in the photo transistor $T_I$ where there is a touch, a voltage drop is generated in the electrode of the one side of the maintenance capacitor $C_s$ which has been charged with the voltage $V_F$. That is, the voltage of the electrode of the one side of the maintenance capacitor $C_s$ is dropped to the voltage level applied in the source signal line $V_s$. However, when there is no touch, i.e. when the photo transistor $T_I$ is not operated, the voltage drop of the capacitor $C_s$ is not generated.

When the switching transistor $T_R$ is turned on again and there is a touch, the maintenance capacitor $C_s$ is recharged. Current is generated in the read out signal line $V_{RO}$ in the recharging, and the generated current is charged to a capacitor $C_F$ included in an operational amplifier. The touch is recognized by a change in a value of $V_0$ according to the change in the voltage of the capacitor $C_F$ of the operational amplifier. However, when there is no touch, the recharging of the voltage is not generated.

Here, the voltage applied to the source signal line $V_s$ and the voltage applied to the power line $V_B$ may be a negative DC voltage, and the voltage $V_F$ applied in the signal line $V_{RO}$ may be a positive DC voltage.

Figure 10:
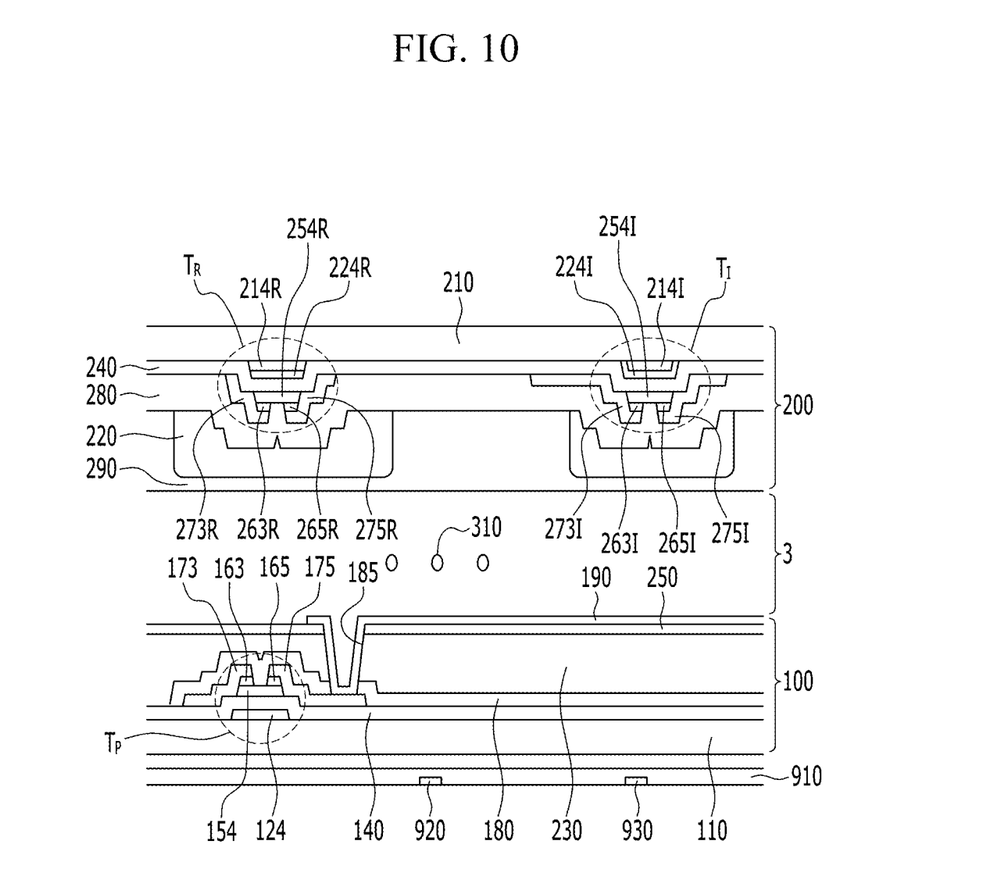
FIG. 10 is a cross-sectional view illustrating another exemplary embodiment of a liquid crystal display device according to the invention.

FIG. 10 is a cross-sectional view illustrating another exemplary embodiment of a liquid crystal display device according to the invention.

The exemplary embodiment of FIG. 10 shows a display device including the photo transistor described with reference to FIGS. 1 and 2, as applied to a liquid crystal display device, but is not limited thereto or thereby.

The contents repeated with those described with reference to FIGS. 1 and 2 will be omitted, and added contents will be only described.

Referring to FIG. 10, the exemplary embodiment of a display device according to the invention includes an upper display panel 200 including a photo transistor TI and a switching transistor TR, a lower display panel 100 facing the upper display panel 200, and a liquid crystal layer 3 interposed between the two display panels 100 and 200.

The liquid crystal layer 3 may have a negative dielectric anisotropy, and liquid crystal molecules 310 of the liquid crystal layer 3 may be aligned in such a manner that longitudinal axes of the liquid crystal molecules 310 are almost vertical to surfaces of the two display panels 100 and 200 in a state of no electric field.

Alignment layers (not shown) may be on inner sides of the display panels 100 and 200, and the alignment layers may be vertical alignment layers.

The illustrated exemplary embodiment of the display device may further include a lower polarizer plate (not shown) positioned under the lower display panel 100 and an upper polarizer plate (not shown) positioned above the upper display panel 200. A strength of the light provided to the lower display panel 100 and the upper display panel 200 may be adjusted by using a polarization property of the lower polarizer plate and the upper polarizer plate.

The illustrated exemplary embodiment of the display device may further include a backlight unit 910 positioned under the lower display panel 100. The backlight unit 910 may include at least one infrared ray emitter 920 and at least one visible ray emitter 930. The infrared ray emitter 920 and the visible ray emitter 930 may be the same light source, such as a light emitting diode ("LED"), but is not limited thereto or thereby. Further, the infrared ray and the visible ray emitted from the infrared ray emitter 920 and the visible ray emitter 930, respectively, may be incident to the lower display panel 100 in a substantially vertical direction.

The backlight unit 910 may include a plurality of infrared emitters 920 and visible ray emitters 930. The infrared ray emitters 920 and the visible ray emitters 930 may be uniformly distributed in substantially an entire of the backlight unit 910 in such a manner that effectively all portions of the backlight unit 910 may provide the infrared ray and the visible ray. In one exemplary embodiment, for example, the infrared ray emitters 920 and the visible ray emitters 930 may be alternately arranged, disorderly or randomly arranged, or arranged in a predetermined ratio.

The lower display panel 100 may include a second substrate 110 including transparent glass or plastic, and a pixel transistor $T_P$ on the second substrate 110. The pixel transistor $T_P$ may include a gate electrode 124 on the second substrate 110, a gate insulating layer 140 covering the second substrate 110 and the gate electrode 124, a semiconductor layer 154 positioned on the gate insulating layer 140 while overlapping the gate electrode 124, ohmic contact layers 163 and 165 positioned on the semiconductor layer 154, a source electrode 173 positioned on the ohmic contact layer 163, and a drain electrode 175 positioned on the ohmic contact layer 165 while being spaced apart from the source electrode 173.

The lower display panel 100 may further include a gate line (not shown) positioned on the second substrate 110 and a data line (not shown) intersecting the gate line. Here, the gate line may be physically and electrically connected to the gate electrode 124 of the pixel transistor $T_P$. Further, the data line may be physically and electrically connected to the source electrode 173 of the pixel transistor $T_P$.

The lower display panel 100 may further include a passivation layer 180 covering the pixel transistor $T_P$, a color filter 230 positioned on the passivation layer 180, an overcoat layer 250 positioned on the color filter 230, and a pixel electrode 190 positioned on the overcoat layer 250. Here, the pixel electrode 190 may be connected to the drain electrode 175 of the pixel transistor TP through a contact hole 185 penetrating the overcoat layer 250 and the passivation layer 180.

An exemplary embodiment of a method of sensing an object by using the display device described in FIG. 10 will be briefly described.

As illustrated in FIG. 10, the infrared ray is generated in the backlight unit 910 by the infrared member 920, and the generated infrared ray sequentially passes through the lower display panel 100, the liquid crystal layer 3 and the upper display panel 200. When a touch is generated by an object such as a finger of a user on the display device, the infrared ray which passes through layers of the display device is reflected by the object, and the reflected infrared ray is incident to the photo transistor $T_f$, particularly as an infrared ray sensing transistor, positioned in the upper display panel 200. Accordingly, the touch by the object is sensed, so that information, such as contact or non-contact of the object and a position of the contact, may be recognized.

Since the switching transistor $T_R$ should have high mobility and a high on/off ratio as an addressing transistor, the switching transistor $T_R$ may not be formed of amorphous silicon germanium. Accordingly, a switching transistor and a photo transistor are separately formed in the related art. However, in one or more exemplary embodiment of the display device according to the invention, the switching transistor and the photo transistor may be similarly formed of amorphous silicon germanium such that the two transistors are not separately formed, thereby simplifying a process of manufacturing a display panel and a display device employing the display panel.

Further, one or more exemplary embodiment of the display device according to the invention may reduce shortening of the lifespan of the transistors, the display panel and/or the display device due to a defect generated in a transistor based on an alloy of materials used when amorphous silicon germanium is also used.

In addition, in a display device, since a switching transistor generally has a small applied voltage as compared to a voltage applied to a pixel transistor, the charge mobility may be sufficiently achieved even though the switching transistor includes amorphous silicon germanium.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a first substrate;
a photo transistor which is disposed on the first substrate and operated by light; and
a switching transistor connected to the photo transistor,
wherein
the photo transistor comprises:
a light blocking film on the first substrate,
a first gate electrode on the light blocking film and contacting the light blocking film,
a first semiconductor layer comprising crystalline silicon germanium, on the first gate electrode and overlapping the light blocking film, the crystalline silicon germanium first semiconductor layer defining a channel of the photo transistor, and
a first source electrode and a first drain electrode on the crystalline silicon germanium first semiconductor layer,
the switching transistor comprises:
a second gate electrode on the first substrate,
a second semiconductor layer comprising crystalline silicon germanium, on the second gate electrode and overlapping the second gate electrode, the crystalline silicon germanium second semiconductor layer defining a channel of the switching transistor, and
a second source electrode and a second drain electrode on the crystalline silicon germanium second semiconductor layer, and
the crystalline silicon germanium first semiconductor layer of the channel of the photo transistor is disposed between the first substrate, and each of the first source electrode and first drain electrode, respectively, and the crystalline silicon germanium second semiconductor layer of the channel of the switching transistor is disposed between the first substrate, and each of the second source electrode and second drain electrode, respectively.

2. The display device of claim 1, further comprising:
a power line connected to the first gate electrode,
wherein the power line is formed from a same layer as the first gate electrode.

3. The display device of claim 2, further comprising:
a unitary drain electrode member of which a first portion thereof defines the first drain electrode and a second portion thereof defines the second drain electrode.

4. The display device of claim 3, further comprising:
a gate line connected to the second gate electrode.

5. The display device of claim 4, wherein:
the power line is formed from a same layer as the gate line.

6. The display device of claim 5, wherein:
the power line applies a negative bias voltage to the first gate electrode.

7. The display device of claim 1, further comprising:
a light blocking member on the photo transistor.

8. The display device of claim 7, wherein:
the light blocking member overlaps the crystalline silicon germanium first semiconductor layer.

9. The display device of claim 8, wherein:
the light blocking member has infrared ray transmittance equal to or less than about 0.1%, and optical density equal to or higher than about 4.

10. The display device of claim 1, further comprising:
a source signal line connected to the first source electrode.

11. The display device of claim 10, further comprising:
a read out signal line connected to the second source electrode.

12. The display device of claim 1, further comprising:
a second substrate facing the first substrate; and
a pixel transistor on the second substrate.

13. The display device of claim 1, wherein:
the first gate electrode overlaps the first drain electrode and forms a maintenance capacitor configured to accumulate a leakage current generated in the crystalline silicon germanium first semiconductor layer.

* * * * *